US012638513B2

(12) United States Patent
Beauchemin, III et al.

(10) Patent No.: US 12,638,513 B2
(45) Date of Patent: May 26, 2026

(54) METHOD TO COMPENSATE MEASUREMENT ERROR IN A BATTERY MANAGEMENT SYSTEM

(71) Applicant: Analog Devices International Unlimited Company, Limerick (IE)

(72) Inventors: Richard Rudolph Beauchemin, III, Hollister, CA (US); Cuyler Nicholas Latorraca, Milpitas, CA (US); Patrick Wilhelm, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 695 days.

(21) Appl. No.: 18/155,017

(22) Filed: Jan. 16, 2023

(65) Prior Publication Data

US 2023/0266398 A1    Aug. 24, 2023

Related U.S. Application Data

(60) Provisional application No. 63/313,238, filed on Feb. 23, 2022.

(51) Int. Cl.
| | |
|---|---|
| *G01R 31/388* | (2019.01) |
| *G01R 31/36* | (2020.01) |
| *G01R 31/374* | (2019.01) |
| *G01R 31/389* | (2019.01) |

(52) U.S. Cl.
CPC ....... *G01R 31/388* (2019.01); *G01R 31/3648* (2013.01); *G01R 31/374* (2019.01); *G01R 31/389* (2019.01)

(58) Field of Classification Search
CPC .............. G01R 31/388; G01R 31/3648; G01R 31/3835; G01R 35/005
See application file for complete search history.

(56) References Cited

U.S. PATENT DOCUMENTS

| | | | |
|---|---|---|---|
| 6,404,163 B1 * | 6/2002 | Kapsokavathis ... | H02J 7/00302 |
| | | | 320/104 |
| 7,638,979 B2 | 12/2009 | Vandensande | |
| 7,649,338 B2 | 1/2010 | Seo et al. | |
| 8,008,891 B2 | 8/2011 | Yun et al. | |
| 9,267,996 B2 | 2/2016 | Baughman | |

(Continued)

FOREIGN PATENT DOCUMENTS

| | | |
|---|---|---|
| CN | 103592492 | 2/2014 |
| CN | 104104130 | 10/2014 |

(Continued)

OTHER PUBLICATIONS

"Chinese Application Serial No. 202310154231.7, Office Action mailed Jan. 19, 2026", w/ English translation, 18 pgs.

*Primary Examiner* — Ricky Go
(74) *Attorney, Agent, or Firm* — Schwegman Lundberg & Woessner, P.A.

(57) ABSTRACT

Voltage measurement techniques for battery cells in a battery management system (BMS) are described. Raw voltage measurements may include errors caused by ohmic losses due to cable impedances and other elements in the BMS. The techniques include performing a calibration cycle to generate correction values based on measured response with discharge switches in different states. The techniques also include scaling the correction values during runtime to correct for filter response errors in the voltage measurement.

12 Claims, 12 Drawing Sheets

(56)  References Cited

U.S. PATENT DOCUMENTS

| | | | | |
|---|---|---|---|---|
| 9,753,090 B2 | 9/2017 | Fink | | |
| 9,774,206 B2 | 9/2017 | Kim et al. | | |
| 9,880,224 B2 | 1/2018 | Kudo et al. | | |
| 9,933,489 B2 | 4/2018 | Iino et al. | | |
| 10,124,696 B2 | 11/2018 | Li et al. | | |
| 10,295,600 B2 | 5/2019 | Coenen | | |
| 10,845,420 B2 | 11/2020 | Kamata | | |
| 2003/0235754 A1* | 12/2003 | Maloizel | .............. | G01R 31/396 |
| | | | | 429/61 |
| 2014/0103861 A1* | 4/2014 | Carletti | ............... | H02M 1/4225 |
| | | | | 323/205 |
| 2016/0061901 A1 | 3/2016 | Kudo et al. | | |
| 2017/0141435 A1* | 5/2017 | Butzmann | ........... | H01M 10/425 |
| 2017/0143277 A1 | 5/2017 | Lisogurski | | |
| 2017/0155254 A1* | 6/2017 | Katayama | ........... | H02J 7/00712 |

FOREIGN PATENT DOCUMENTS

| | | |
|---|---|---|
| CN | 108089130 | 5/2018 |
| CN | 112834974 | 5/2021 |
| CN | 116643182 | 8/2023 |
| DE | 102023103902 | 8/2023 |
| JP | 2017108604 | 6/2017 |

* cited by examiner

600

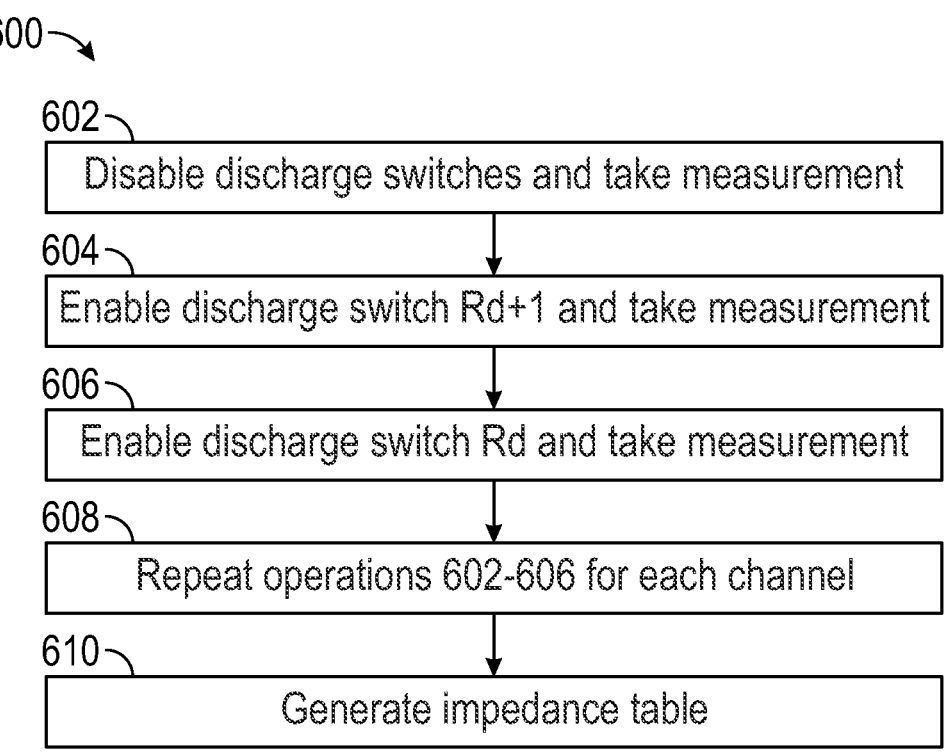

602 — Disable discharge switches and take measurement

604 — Enable discharge switch Rd+1 and take measurement

606 — Enable discharge switch Rd and take measurement

608 — Repeat operations 602-606 for each channel

610 — Generate impedance table

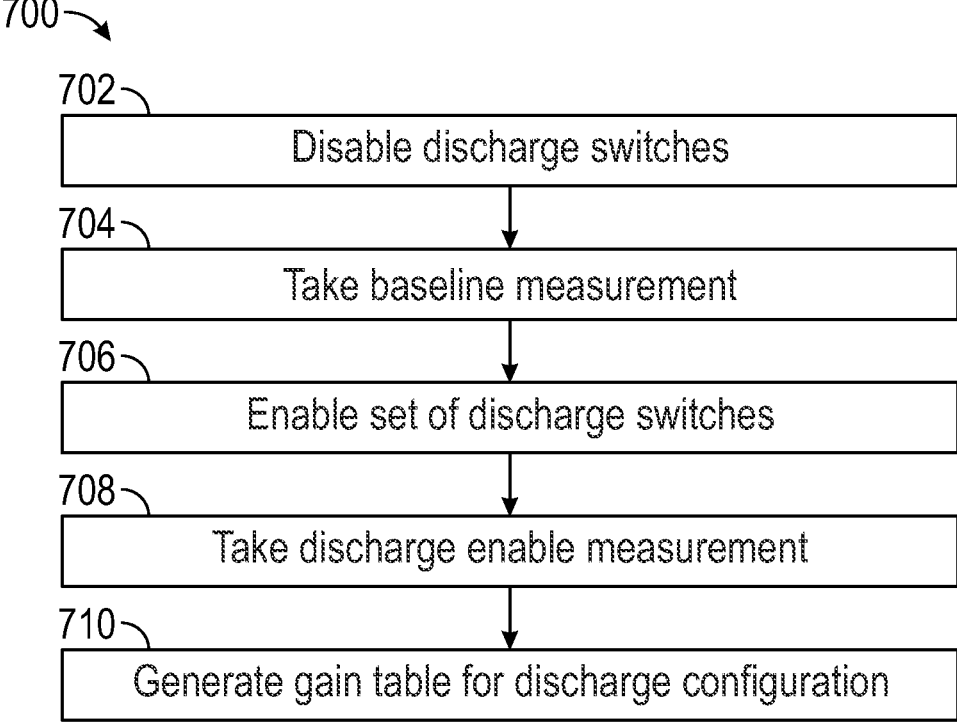

702 — Disable discharge switches

704 — Take baseline measurement

706 — Enable set of discharge switches

708 — Take discharge enable measurement

710 — Generate gain table for discharge configuration

FIG. 7

| ΔCT | A=256 | A=128 | A=32 | A=16 | A=8 | A=4 | A=2 |
|---|---|---|---|---|---|---|---|
| 0 | 0.000000 | 0.000000 | 0.000000 | 0.000000 | 0.000000 | 0.000000 | 0.000000 |
| 1 | 0.003906 | 0.007813 | 0.031250 | 0.062500 | 0.125000 | 0.250000 | 0.500000 |
| 2 | 0.007797 | 0.015564 | 0.61523 | 0.121094 | 0.234375 | 0.437500 | 0.750000 |
| 3 | 0.011673 | 0.023255 | 0.090851 | 0.176025 | 0.330078 | 0.578125 | 0.875000 |
| 4 | 0.015534 | 0.030886 | 0.119262 | 0.227524 | 0.413818 | 0.683594 | 0.937500 |
| 5 | 0.019379 | 0.038457 | 0.146785 | 0.275804 | 0.487091 | 0.762695 | 0.968750 |
| 6 | 0.023210 | 0.045969 | 0.173448 | 0.321066 | 0.551205 | 0.822021 | 0.984375 |
| 7 | 0.027025 | 0.053422 | 0.199278 | 0.363499 | 0.607304 | 0.866516 | 0.992188 |
| 8 | 0.030826 | 0.060817 | 0.224300 | 0.403281 | 0.656391 | 0.899887 | 0.996094 |
| 9 | 0.034612 | 0.068155 | 0.248541 | 0.440575 | 0.699342 | 0.924915 | 0.998047 |
| 10 | 0.038383 | 0.075435 | 0.272024 | 0.475540 | 0.736924 | 0.943686 | 0.999023 |
| 11 | 0.042139 | 0.082658 | 0.294773 | 0.508318 | 0.769809 | 0.957765 | 0.999512 |
| 12 | 0.045881 | 0.089825 | 0.316811 | 0.539048 | 0.798583 | 0.968324 | 0.999756 |
| 13 | 0.049608 | 0.096936 | 0.338161 | 0.567858 | 0.823760 | 0.976243 | 0.999878 |
| 14 | 0.053320 | 0.103991 | 0.358844 | 0.594867 | 0.845790 | 0.982182 | 0.999939 |
| 15 | 0.057018 | 0.110991 | 0.378880 | 0.620188 | 0.865066 | 0.986637 | 0.999969 |
| 16 | 0.060702 | 0.117936 | 0.398290 | 0.643926 | 0.881933 | 0.989977 | 0.999985 |
| 17 | 0.064371 | 0.124827 | 0.417093 | 0.666181 | 0.896691 | 0.992483 | 0.999992 |
| 18 | 0.068026 | 0.131665 | 0.435309 | 0.687044 | 0.909605 | 0994362 | 0.999996 |
| 19 | 0.071666 | 0.138448 | 0.452956 | 0.706604 | 0.920904 | 0.995772 | 0.999998 |
| 20 | 0.075293 | 0.145179 | 0.470051 | 0.724941 | 0.930791 | 0.996829 | 0.999999 |
| 21 | 0.078905 | 0.151858 | 0.486612 | 0.742132 | 0.939442 | 0.997622 | 1.000000 |
| 22 | 0.082503 | 0.158484 | 0.502655 | 0.758249 | 0.947012 | 0.998216 | 1.000000 |
| 23 | 0.086087 | 0.165058 | 0.518197 | 0.773359 | 0.953636 | 0.998662 | 1.000000 |
| 24 | 0.089657 | 0.171581 | 0.533253 | 0.787524 | 0.959431 | 0.998997 | 1.000000 |
| 25 | 0.093213 | 0.178053 | 0.547839 | 0.800803 | 0.964502 | 0.999247 | 1.000000 |
| 26 | 0.096755 | 0.184475 | 0.561969 | 0.813253 | 0.968939 | 0.999436 | 1.000000 |
| 27 | 0.100283 | 0.190846 | 0.575658 | 0.824925 | 0.972822 | 0.999577 | 1.000000 |
| 28 | 0.103798 | 0.197167 | 0.588918 | 0.835867 | 0.976219 | 0.999683 | 1.000000 |
| 29 | 0.107299 | 0.203439 | 0.601765 | 0.846125 | 0.979192 | 0.999762 | 1.000000 |
|  | ... | ... | ... | ... | ... | ... | ... |

FIG. 9A

| ΔCT | a=256 | a=128 | a=32 | a=16 | a=8 | a=4 | a=2 |
|---|---|---|---|---|---|---|---|
| 0 | 0.000000 | 0.000000 | 0.000000 | 0.000000 | 0.000000 | 0.000000 | 0.000000 |
| 4 | 0.015534 | 0.030886 | 0.119262 | 0.227524 | 0.413818 | 0.683594 | 0.937500 |
| 8 | 0.030826 | 0.060817 | 0.224300 | 0.403281 | 0.656391 | 0.899887 | 0.996094 |
| 12 | 0.045881 | 0.089825 | 0.316811 | 0.539048 | 0.798583 | 0.968324 | 0.999756 |
| 16 | 0.060702 | 0.117936 | 0.398290 | 0.643926 | 0.881933 | 0.989977 | 0.999985 |
| 20 | 0.075293 | 0.145179 | 0.470051 | 0.724941 | 0.930791 | 0.996829 | 0.999999 |
| ⋮ | ⋮ | ⋮ | ⋮ | ⋮ | ⋮ | ⋮ | ⋮ |

FIG. 9B

METHOD TO COMPENSATE MEASUREMENT ERROR IN A BATTERY MANAGEMENT SYSTEM

CLAIMS OF PRIORITY

This patent application claims the benefit of priority U.S. Provisional Patent Application Ser. No. 63/313,238, titled "METHOD To COMPENSATE MEASUREMENT ERROR IN A BATTERY MANAGEMENT SYSTEM," filed on Feb. 23, 2022, which is hereby incorporated by reference herein in its entirety.

TECHNICAL FIELD

The present disclosure generally relates to a Battery Management System (BMS), in particular compensation of measurement errors.

BACKGROUND

Electric vehicles (EVs) are gaining popularity. One challenge for the adoption of EVs is battery maintenance. A battery management system (BMS) can be used to monitor different operating conditions of a battery, such as those used in EVs. Typically, conditions such as voltage and surface temperature can be measured using a BMS.

For instance, a BMS can use specialized hardware to sense cell voltages and load individual cells in a battery stack to maintain cell health, maximize energy use, and minimize safety hazards. However, the hardware used by the BMS can introduce ohmic losses, resulting in voltage measurement error.

BRIEF DESCRIPTION OF THE DRAWINGS

Various ones of the appended drawings merely illustrate example embodiments of the present disclosure and should not be considered as limiting its scope.

FIG. 6 illustrates a flow diagram of a method to determine cable impedances.

FIG. 7 illustrates a flow diagram of a method to determine voltage gain factors.

FIG. 9A illustrates portions of a lookup table for IIR filter unit step response with CT-increment 1.

FIG. 9B illustrates portions of a reduced size lookup table for IIR filter unit step response with CT-increment 4.

DETAILED DESCRIPTION

Voltage measurement techniques for battery cells in a battery management system (BMS) are described. Raw voltage measurements may include errors caused by ohmic losses due to cable impedances and other elements in the BMS. The voltage measurement techniques include performing a calibration cycle to generate correction values based on measured responses with discharge switches in different enable/disable states. The techniques also include scaling the correction values during runtime to correct for filter response errors in the voltage measurement.

Disclosed herein is a method to compensate for a measurement error in a battery management system. The method comprising a performing a calibration cycle to calculate a set of correction factors, the calibration cycle including: disabling one or more discharge switches in the battery management system, performing a first measurement based on the disabling one or more discharge switches, enabling one or more discharge switches in the battery management system, performing a second measurement based on the enabling one or more discharge switches, and determining the set of correction factors based on the first and second measurements. The method comprising receiving a raw voltage measurement and applying at least one correction factor from the set of correction factors to generate a compensated voltage measurement.

Figure 1:
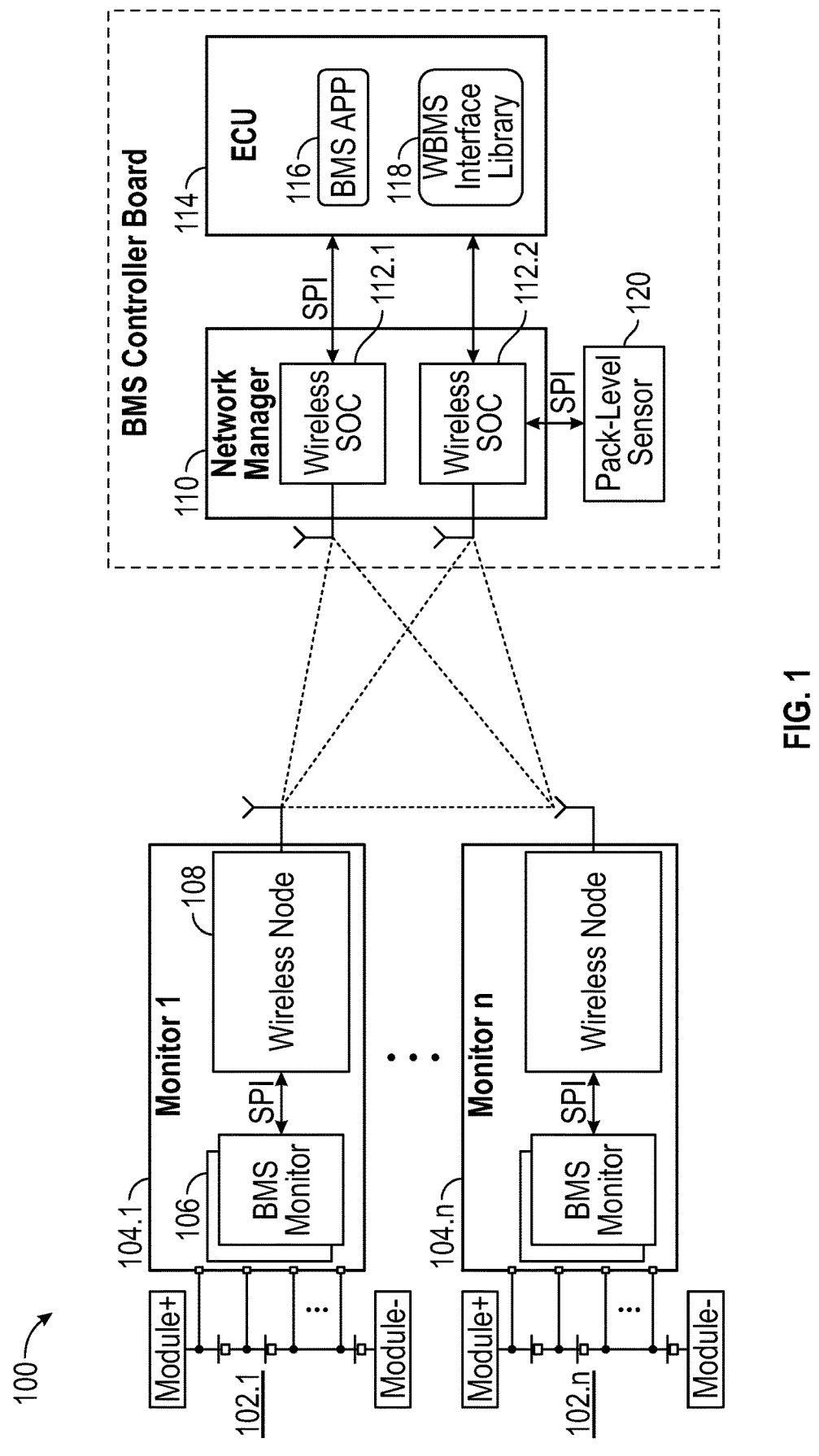
FIG. 1 illustrates a block diagram of a wireless battery management system.

Voltage measurement techniques described herein may be used in a wired BMS, a wireless BMS (WBMS), or a combination thereof. FIG. 1 illustrates a block diagram of a WBMS 100. The WBMS 100 may include a plurality of battery modules 102.1-102.$n$, each including a plurality of battery cells. For example, the battery modules 102.1-102.$n$ may be lithium-ion batteries. Batteries with different specifications, sizes, and shapes may be used. Each module may be coupled to a respective Monitor 104.1-104.$n$. The WBMS 100 may also include a Network Manager 110 and an Electronic Control Unit (ECU) 114.

Each Monitor 104.1-104.$n$ may include one or more BMS Monitors 106 and a Wireless Node 108. The BMS Monitor 106 may be coupled to a battery module and may monitor various conditions or properties of the battery module. The BMS Monitor 106 may be provided as an integrated circuit, which can include a monolithically integrated BMS circuit or an integrated module including multiple integrated circuit die or other circuit elements within a commonly-shared integrated circuit device package, as illustrative examples.

The BMS Monitor 106 may include a variety of sensors. The BMS Monitor 106 may sample the battery voltage to monitor the battery level. The BMS Monitor may also monitor current of the battery module and the external surface temperature.

The BMS Monitor 106 may be coupled to the Wireless Node 108 by a communication interface, for example by a Serial Peripheral Interface (SPI) or the like. The BMS Monitor 106 and the Wireless Node 108 may be provided on a single printed circuit board (PCB). The Wireless Node 108 may include wireless system on chip, which may include a radio transceiver to communicate the battery measurements to the Network Manager 110 over a wireless network. In an example, the wireless node 108 may include a Functional Safety (FuSa) central processing unit (CPU) to handle certain battery condition measurements.

The Network Manager 110 may include one or more wireless SOCs 112.1-112.2 to communicate with the Monitors 104.1-104.$n$. The Network Manager 110 may be coupled to the ECU 114 and a pack-level sensor 120 by respective communication interfaces, for example SPI. The ECU 114 may include a BMS application 116 and WBMS interface library 118 to control operation of the WBMS 100.

Figure 2:
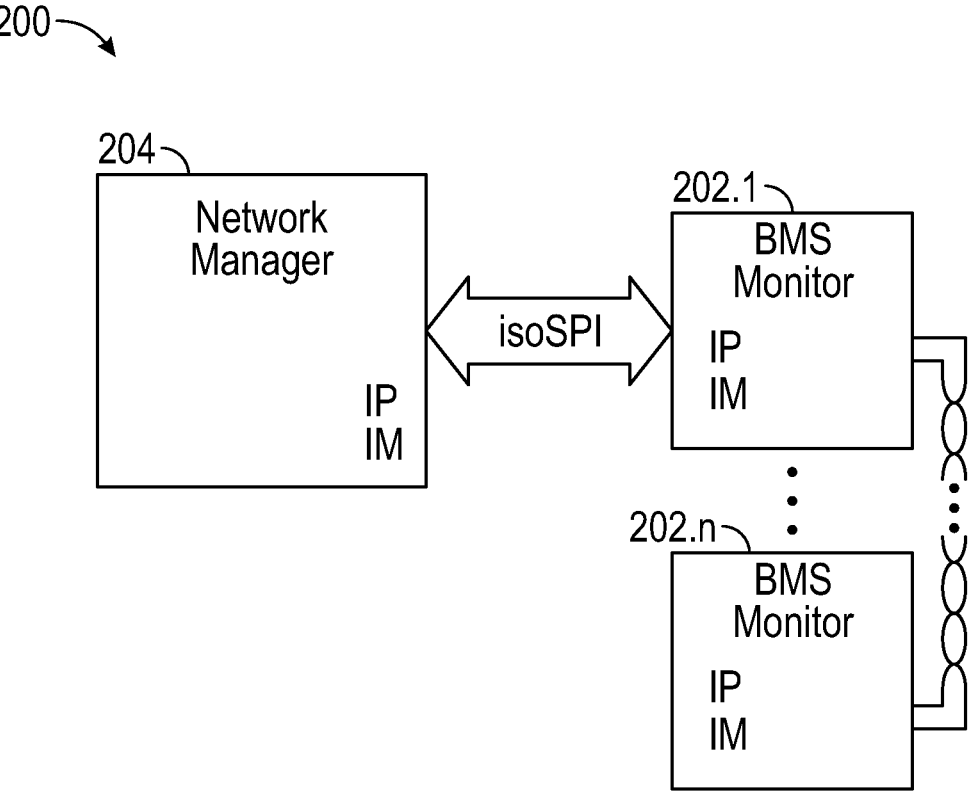
FIG. 2 illustrates a block diagram of a wired battery management system.

FIG. 2 illustrates a block diagram of a wired BMS 200. The wired BMS 200 may include a plurality of BMS Monitors 202.1-202.*n* and a Network Manager 204. As described above with reference to FIG. 1, the BMS Monitors 202.1-202.*n* may include a variety of sensors. The BMS Monitor 202.1-202.*n* may sample the battery voltage to monitor the battery level. The BMS Monitor 202.1-202.*n* may also monitor current of the battery module and the external surface temperature.

The BMS Monitors 202.1-202.*n* may communicate with the Network Manager 204 through a wired communication interface in this example. For example, the wired communication interface may include isolated (transformer) communication cabling, such as implementing an Isolated Serial Peripheral Interface (SPI). The communication cabling may be connected in a serial fashion from module to module, e.g., daisy chained from monitor to monitor with the last slave monitor providing a termination point for the cabling.

A BMS monitor can continuously sample cell voltages to provide more efficient noise filtering and reduce (or eliminate) aliasing error. The continuous sampling, however, can introduce challenges such as measurement errors. Most systems can share discharge and measurement wires, and cable impedances can cause measurement error when attempting to measure and discharge a battery cell at the same time.

Figure 3:
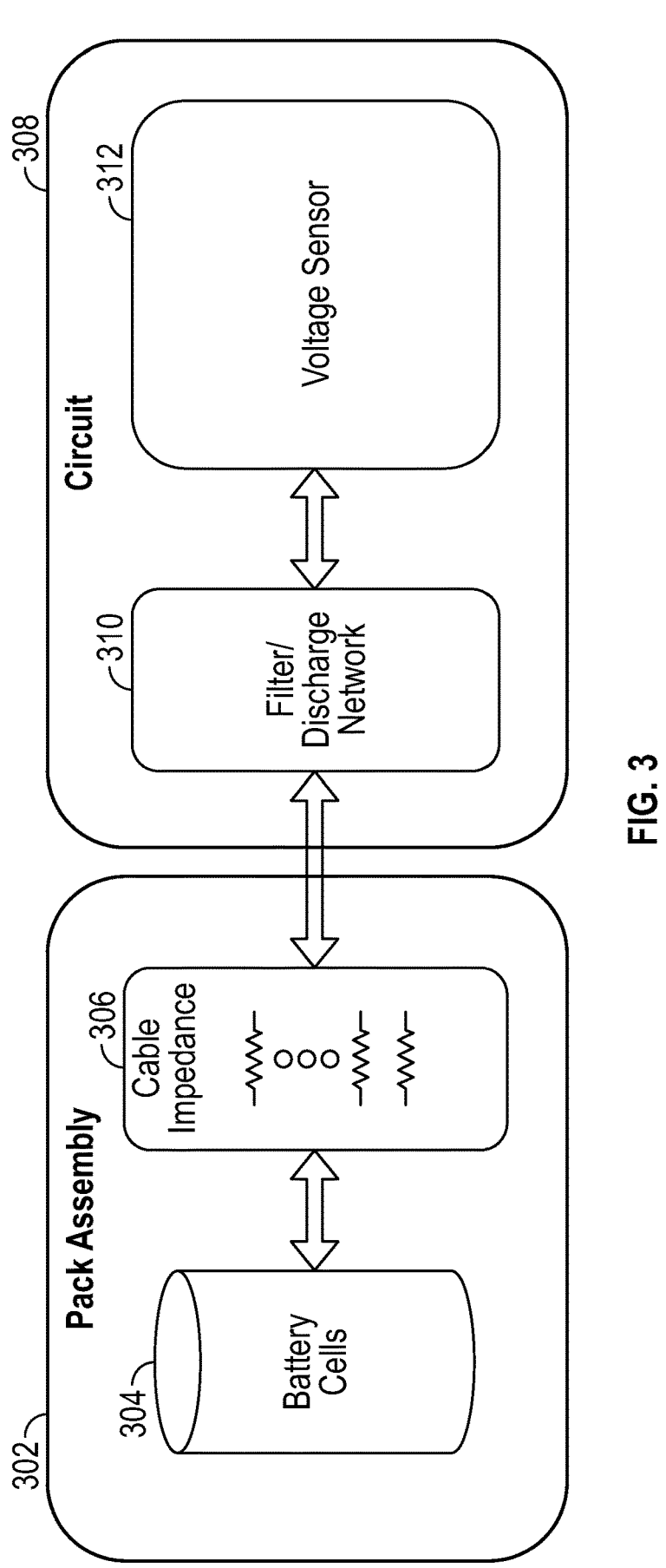
FIG. 3 illustrates example portions of a voltage measurement system.

FIG. 3 illustrates example portions of a voltage measurement system associated with a BMS with continuous sampling. As shown, a pack assembly 302 includes battery cells 304 and respective cable impedances 306. The pack assembly may be coupled to a circuit 308, which may be provided as printed circuit board (PCB), such as a flexible PCB. The circuit 308 may include a filter/discharge network 310 and a voltage sensor 312. The filter/discharge network 310 may include discharge and sense lines. The voltage sensor 312 may include a plurality of analog-to-digital converters to measure voltage responses of respective cells of the battery cells 304. Measurement error can be introduced by the impedances of the discharge and sense lines and the cable lines. Even small impedances can cause significant measurement errors. For example, the discharge/sense lines in the circuit 308 can introduce up to 1-2 Ohms of series impedance, which can result in hundreds of millivolts of measurement error.

Figure 4:
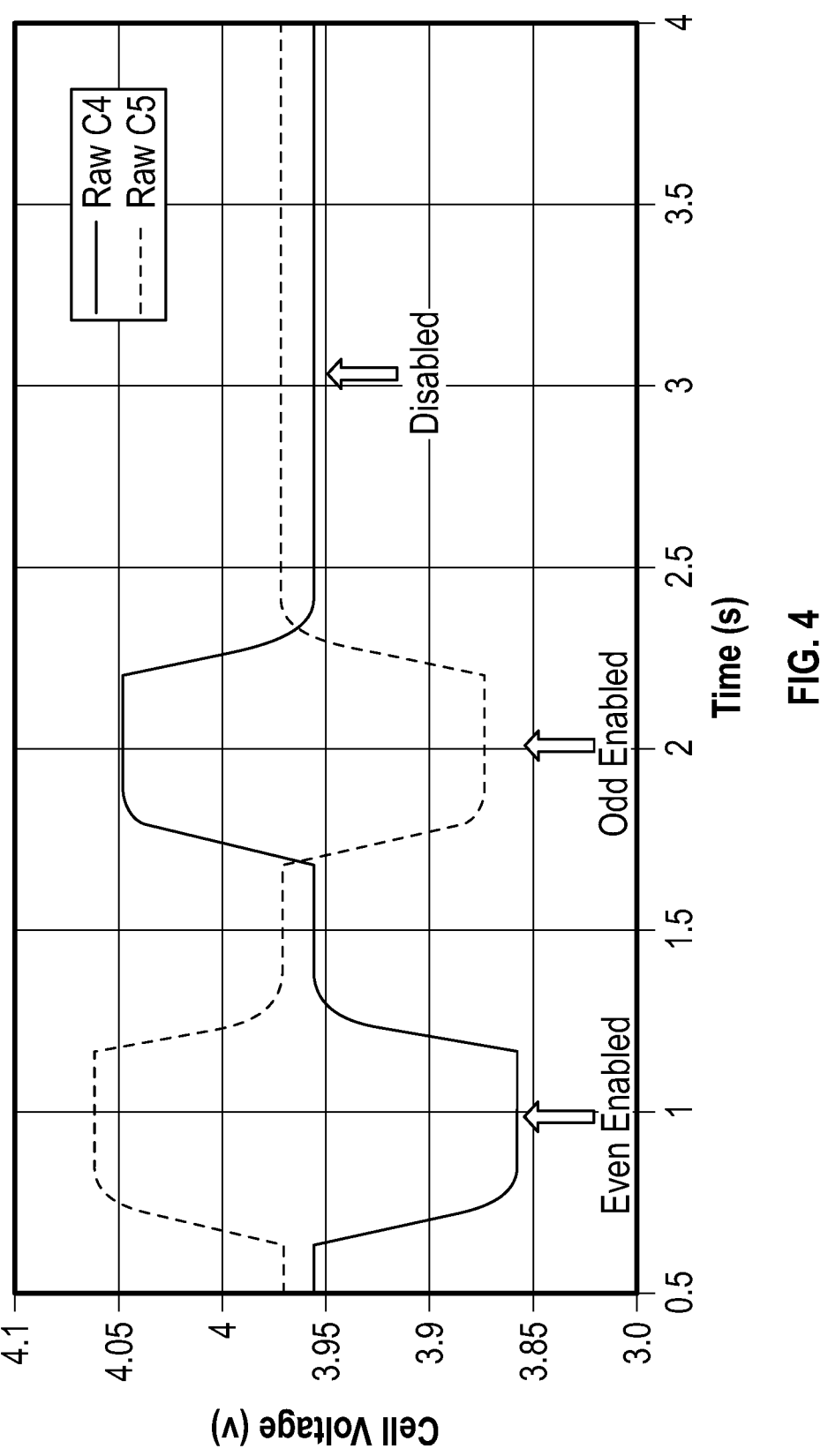
FIG. 4 illustrates a battery cell voltage plot.

FIG. 4 illustrates a battery cell voltage plot showing sources of measurement error caused by discharge switch activation during continuous measurement. FIG. 4 shows cell voltage in the y-axis and time in the x-axis of two cell voltage measurements (e.g., C4 and C5). As shown, the cell voltages have a DC offset depending on which discharge switches are enabled. Those offsets can contribute to measurement errors. Moreover, before reaching the steady state to or from those offset values, the cell voltages include a slewing error (e.g., slope to and from the DC steady-state offset) caused by filter properties used in the voltage measurements.

Next, techniques for compensating for measurement errors are described. Techniques for discharge voltage error compensation as well as techniques to scale this voltage error compensation to account for filter responses are described.

In a first approach referred to as impedance calculation technique herein, cable impedances, which contribute to measurement errors because of their ohmic loss, can be directly calculated using measurements taken with discharge switches enabled and disabled in a in a specified manner. This first approach, as described in further detail below, may include several calibration steps and allows for flexible use of discharge switches, and it provides the BMS with information on the state of the system impedances.

In a second approach referred to as voltage gain technique, a gain factor can be calculated using measurements taken with discharge switches enabled and disabled in a specific manner using a selected discharge configuration. The second approach can have a shorter calibration routine with the different measurement cycles requiring less computational resources as compared to the first approach, but may include recalibration in response to changes in the discharge switch configuration.

Both approaches include calibration changes to address changes in system impedance. The frequency of calibration can be determined by a system integrator based on analysis of temperature dependance and the accuracy of the compensated measurement. Moreover, as described in further detail below, after determining correction factors using either the first or second approach, the correction factors can be scaled to account for variations in filter responses, such as a filter used for the voltage measurement.

The techniques for compensating for measurement errors described herein may be executed by one or more processors associated with the BMS. For example, the techniques can be executed by a BMS application in an ECU, as described above.

Figure 5A:
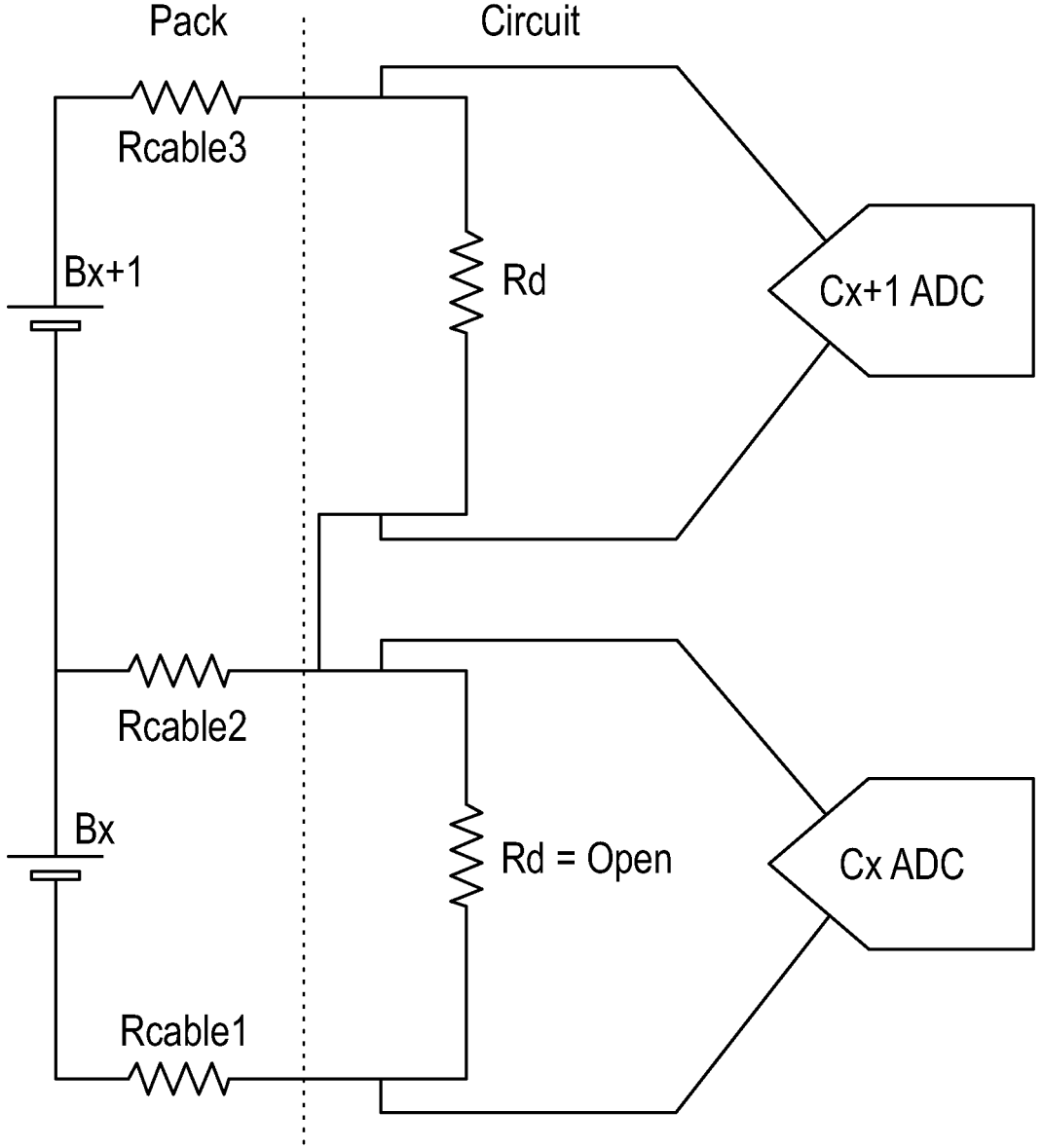
FIGS. 5A-5B show example portions of a circuit diagram of a voltage measurement system.

FIG. 5A shows example portions of a circuit diagram of a voltage measurement system 500. Here, two channels of the voltage measurement system 500 are shown for simplicity and brevity, and the voltage measurement system may include more than two channels (e.g., 16 channels). The respective channels may measure a voltage response of a respective battery cell. Two battery cells Bx, Bx+1 are shown. In a first channel, Bx may be coupled to cable impedances Rcable1, Rcable2. A discharge switch Rd may be coupled to the cable impedances Rcable1, Rcable2. An ADC (analog-to-digital converter) Cx may be provided to measure the voltage response of the first battery cell Bx. In the second channel, Bx+1 may be coupled to cable impedances Rcable2, Rcable3. A discharge switch Rd+1 may be coupled to the cable impedances Rcable1, Rcable2. An ADC Cx+1 may be provided to measure the voltage response of the second battery cell Bx+1. The cable impedances Rcable1, Rcable2, Rcable3 may introduce error in the voltage measurements because of their unknown impedances. These additional cable impedances may therefore cause a voltage drop in the voltage measurement.

The impedance calculation technique addresses the measurement error by calculating the impedances introduced in the system between the circuit (e.g., circuit 308) and the battery cells (e.g., battery cells 304) including primarily wiring impedances. With the impedances calculated, the state of the discharge switches can then be used to calculate the losses introduced by the system and applied back to the measurement in runtime. In the impedance calculation technique, these cable impedances can be directly calculated using measurements taken with discharge switches enabled and disabled in a specific manner.

FIG. 6 illustrates a flow diagram of a method 600 to determine cable impedances. At operation 602, discharge switches Rd and Rd+1 are disabled (e.g., open) and a voltage measurement is taken using ADC Cx of cell Bx. Here, because the discharge switches are disabled, there is no voltage drop from the cable impedances and Cx=Bx.

Figure 5B:
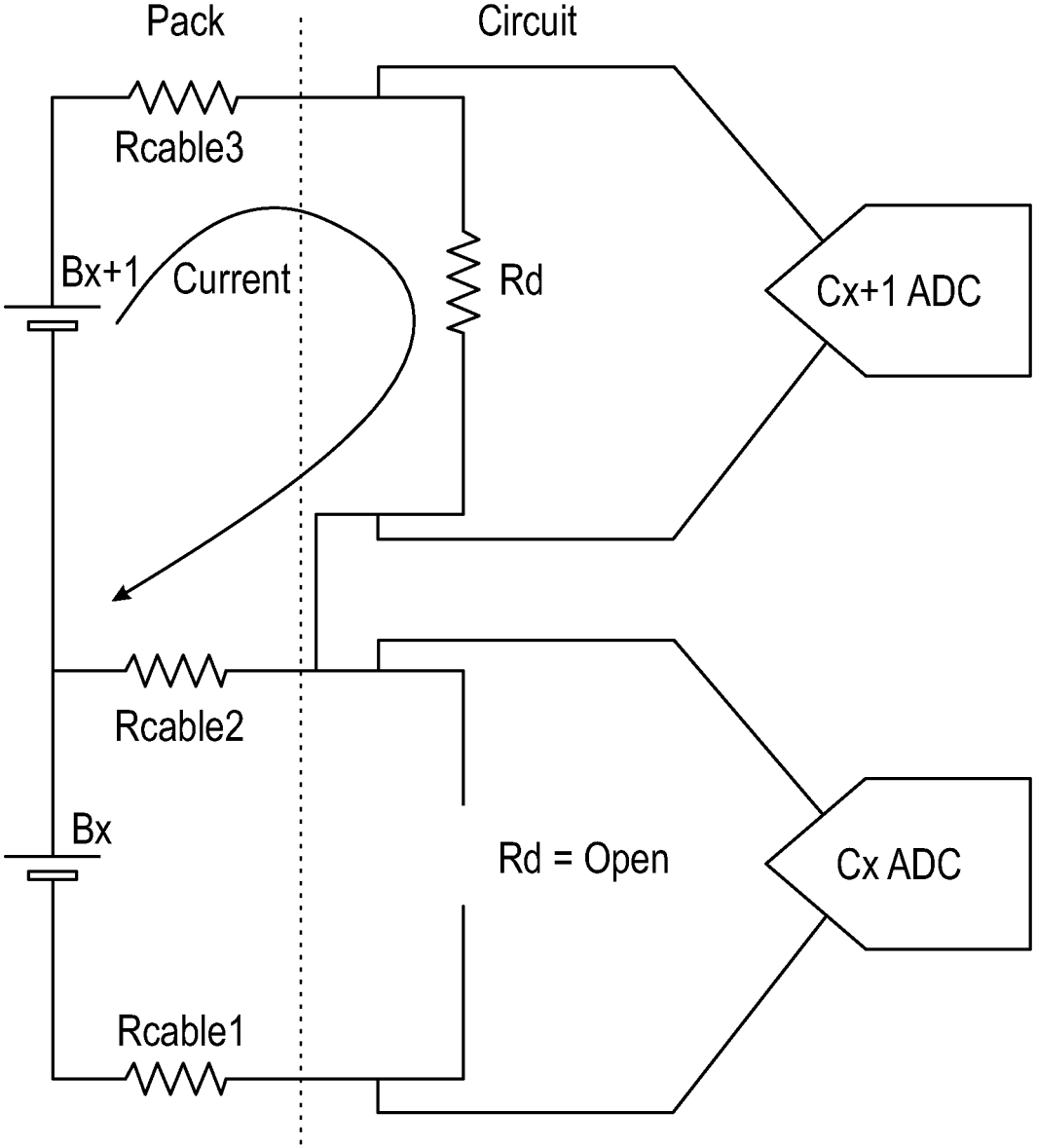

At operation 604, discharge switch Rd+1 is enabled (e.g., closed) while discharge switch Rd remains disabled and voltage measurement is taken using ADC Cx and Cx+1. The circuit diagram of with Rd+1 enabled is shown in FIG. 5B. With Rd+1 enabled, a current (I) flows in the second channel as shown. The current I can be measured, and the value of Rd+1 is known; therefore, the value of Rcable2 can be calculated using the following relationships:

$$Cx=Bx+I*Rcable2$$

$$I=(Cx+1)/(Rd+1)$$

$$Rcable2=(Cx-Bx)*(Rd+1)/(Cx+1)$$

At operation 606, discharge switch Rd may be enabled (e.g., closed) while Rd+1 is disabled, and voltage measurement is taken. The value of Rcable1 may then be calculated because the value of Rd is known and the current flowing in channel 1 can be measured.

At operation 608, the first three operations (602-606) may be repeated for respective channels in the BMS and the respective cable impedances in the channels may be calculated. At operation 610, an impedance table of the cable impedances in the BMS can be generated to be used in runtime. In runtime, based on the switch configuration, the relevant cable impedances may be retrieved from the impedance table, and a corresponding correction factor may be applied to the voltage measurement to compensate for the voltage drop of the relevant cable impedances. Because the impedances are calculated, changes to the discharge configuration do not trigger recalibration, so recalibration is not needed when changing to a new discharge configuration. However, the impedance calculation calibration may be re-run if the impedances in the voltage measurement are expected to change (e.g., due to temperature change).

The voltage gain technique addresses the measurement error by creating a correction factor (e.g., gain factor) based on the cell measurements with the desired discharge switches to be used in runtime enabled. These gain factors can then be applied to measurements with the discharge switches active to compensate the changes introduced during runtime. However, because the gain factors are dependent on discharge switch configuration, a new set of gain factors are calculated when the discharge switch configuration changes (e.g., changes to set of discharge switches active).

FIG. 7 illustrates a flow diagram of a method 700 to determine voltage gain factors. At operation 702, discharge switches in a voltage system (e.g., Rd, Rd+1) are disabled. At operation 704, a baseline measurement is taken. If the battery cells are in use, the system may wait for the filter in the voltage measurement system (e.g., IIR filter) to settle before taking the baseline measurement, as described in further detail below. At operation 706, a set of discharge switches may be enabled. The set of enabled discharge switches correspond to the discharge switch configuration to be used in runtime. At operation 708, a discharge enable measurement is taken. At operation 710, a gain table of gain factors for the particular discharge switch configuration may be determined based on the baseline measurement and discharge enable measurement. For example, the gain factor may be represented by:

$$Baseline\ Measurement/Discharge\ Enabled\ Measurement$$

In runtime, a correction factor (e.g., gain factor) can be applied to the voltage measurement to compensate for the voltage measurement error. As mentioned above, a new set of correction factors may be calculated when the discharge switch configuration is changed. For example, the system may detect that the discharge switch configuration has changed and may re-run method 700 to calculate a new set of correction factors (e.g., gain table) based on the new discharge configuration. Moreover, the voltage gain calibration may also be re-run if the impedances in the voltage measurement are expected to change (e.g., due to temperature change). When switching between even and odd discharge switches often, the system may generate two gain tables, one table for even discharge switches and one table for odd discharge switches, to accommodate the change between discharge configuration without recalculating the correction factors.

As discussed above, another source of measurement error can be introduced by filter properties used in the voltage measurement. An analog or digital filter may be used. For example, an infinite impulse response (IIR) filter may be used following the analog-to-digital conversion.

An analog or digital filter response may be determined, and a scaling factor based on the digital response may be calculated. The scaling factor may then be applied to the measurement values as described in further detail below.

When using an IIR filter, changes to the discharge switch configuration are not immediately observed, rather they roll off according to the IIR step response. To accommodate for this rolling IIR step response, the correction factor determined with the impedance calculation or voltage gain approaches can be scaled according to where the sample is in the transfer function of the IIR. The scaling factor can be calculated using the implicit form of the IIR transfer function or the explicit form of its step response, or by using a lookup table. The use of the lookup table can save on computation time as the other techniques involve iterative calculations or a power function.

A running conversion counter (CT) can be used to keep track of the appropriate position in time. In the case of an analog filter, a time value may be maintained by a clock. The number of entries in the lookup table can be scaled according to the desired cell update rate as well as the desired accuracy of the applied correction factor. If compensated measurements are used during the calibration phases discussed above and the IIR filter is in use, then the measurements made during calibration may also be scaled. In the case of the impedance calculation approach, the old impedance table can be used for the compensation alongside the current discharge configuration with the appropriate IIR scaling applied. In the case of the voltage gain approach, if the discharge configuration has changed, then the old gain table may be inadequate for compensated results during calibration. Instead, the system may dynamically update the gain table during the calibration phase. The known IIR step response can be used for this update. With the base measurement recorded, and the step response known, subsequent measurements can be used to calculate an inferred gain factor:

$$gain=(cal\_base-cal\_meas+\ cal\_meas*IIR\_scale\_factor)/\ (cal\_meas*IIR\_scale\_factor).$$

With the new gain factor recorded, the subsequent measurements can be compensated. This process can be repeated until the filter has settled in which time the gain factor can be calculated normally.

Figure 8:
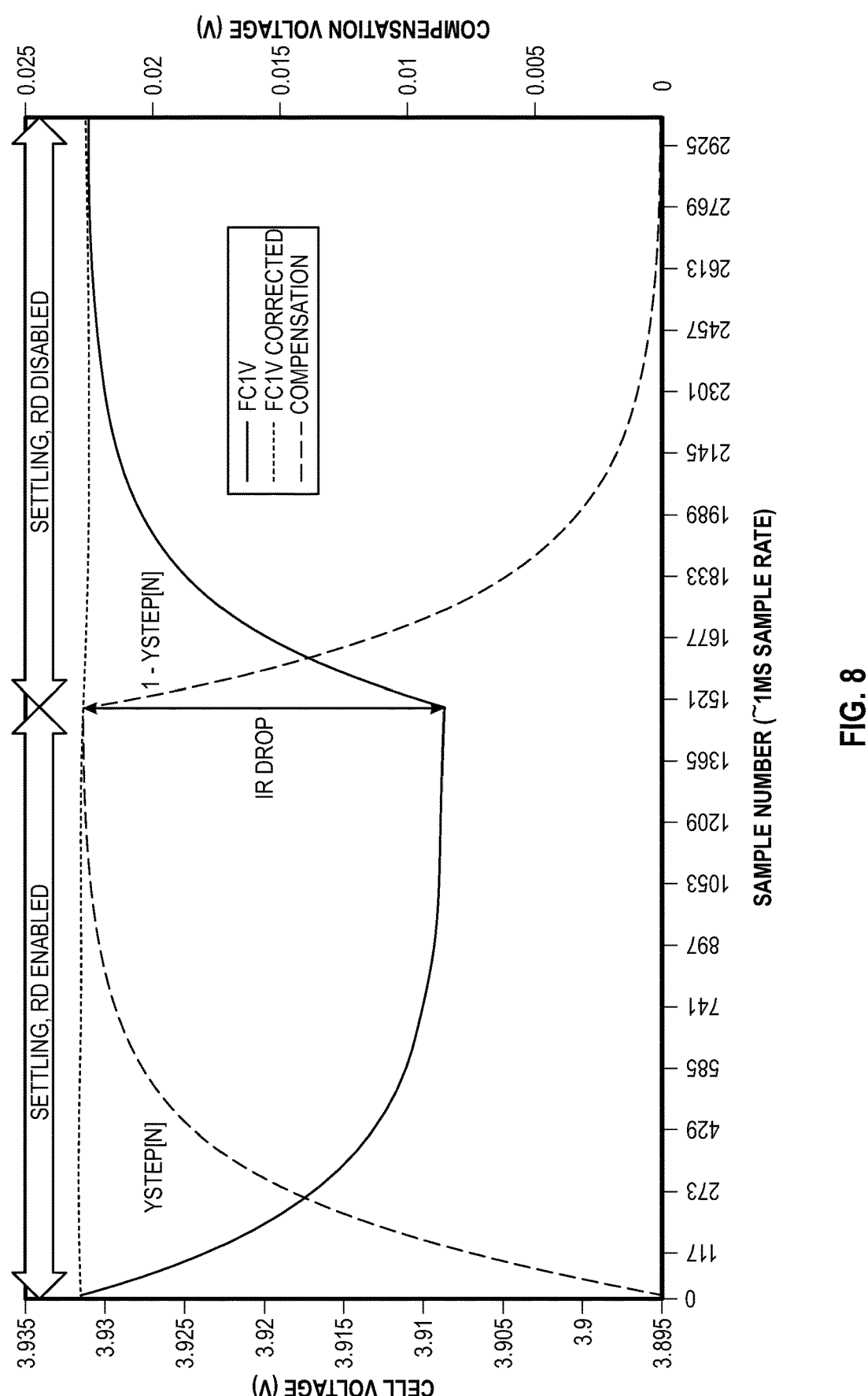
FIG. 8 shows a plot of the cell voltage and IIR response scaling.

The transfer function of the IIR filter can be represented as:

$$Y[n]=Y[n-1]+(X[n]-Y[n-1])/a$$

where X[n] represents the nth input, Y[n] represents the nth output, and a is a programmable filter parameter. For the purposes of determining the scaling factor, unit step response of the IIR filter can be rewritten in an explicit (equation not dependent on past outputs) way as:

$$Y_{step}[n] = 1 - (1 - 1/a)^n$$

where Ystep[n] represents the scaling factor when the discharge is activated, a is the programmable filter parameter, and n is the sample number. FIG. 8 shows a plot of the cell voltage and IIR response scaling. As shown, the scaling is applied when switches are disabled (1–Ystep[n]) in one direction and in another direction when switches are enabled (Ystep[n]).

To save on computation time, a lookup table can be derived from the function above. The appropriate index in this table can be determined by using the CT value of the current conversion minus the CT value of the conversion closest to the discharge switch configuration change (accounting for CT overflow). FIG. 9A illustrates portions of a lookup table for IIR filter unit step response with CT-increment 1. Reduced sizes of lookup tables can also be used. For example, a reduced table can include delta CT values at different step intervals, such as steps of 4. The use of a reduce table can result in small steps of the correction output, but this tradeoff may still lead to efficiencies when, for example, the steps are small compared to the uncertainty of other error sources. FIG. 9B illustrates portions of a reduced size lookup table for IIR filter unit step response with CT-increment 4.

Figure 10:
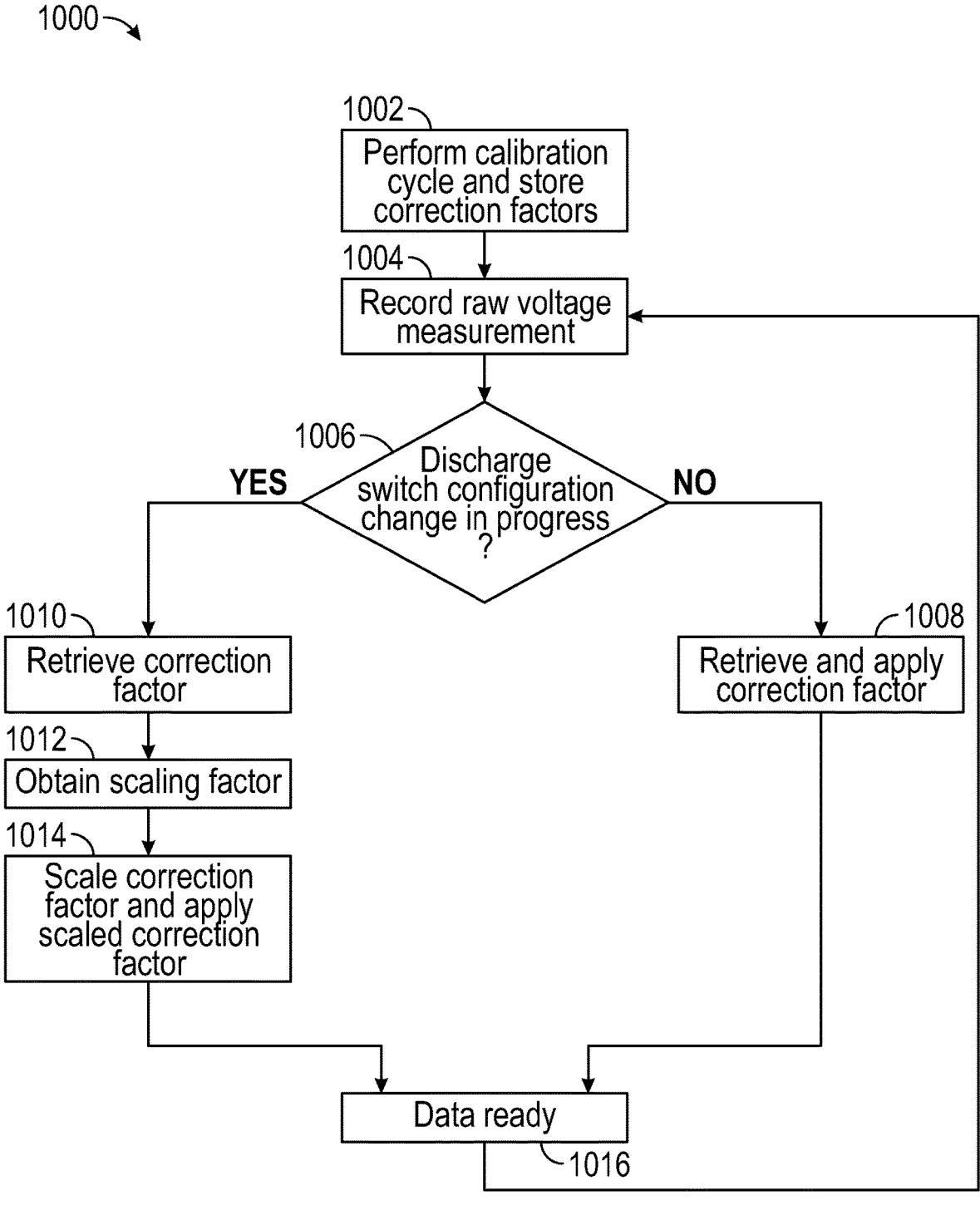
FIG. 10 illustrates a flow diagram of a method 1000 for generating voltage measurements with error compensation.

FIG. 10 illustrates a flow diagram of a method 1000 for generating voltage measurements with error compensation. At operation 1002, a calibration cycle may be performed to determine correction factors to compensate for ohmic losses. For example, the impedance calculation technique or voltage gain technique described above may be performed to determine correction factors to be used in runtime. The determined correction factors may be stored.

Runtime operations may include obtaining raw voltage measurements and correcting the raw voltage measurements for measurements errors. At operation 1004, a raw voltage measurement may be recorded. Also, a filter response property and time may also be recorded. For example, the IIR measurement may be recorded and CT may be recorded.

At operation 1006, the system may check if a discharge switch configuration change is in progress to determine whether scaling is to be performed to address slewing error. If the discharge switch configuration change is not in progress, then, at operation 1008, a corresponding correction factor based on the discharge configuration is retrieved from the stored correction factors and applied to the voltage measurement.

If the discharge switch configuration change is in progress, then, at operation 1010, the corresponding correction factor based on the discharge configuration is retrieved. At operation 1012, the appropriate scaling factor from the unit step response look up to table may be obtained. At operation 1014, the corrective factor may be scaled using the scaling factor and the scaled correction factor may be applied to the voltage measurement. At operation 1016, the system may be then ready for the next measurement (e.g., data ready). In some examples, the calibration cycle may be performed again if the discharge configuration has changed and if the calibration cycle is using the voltage gain technique described above.

Figure 11:
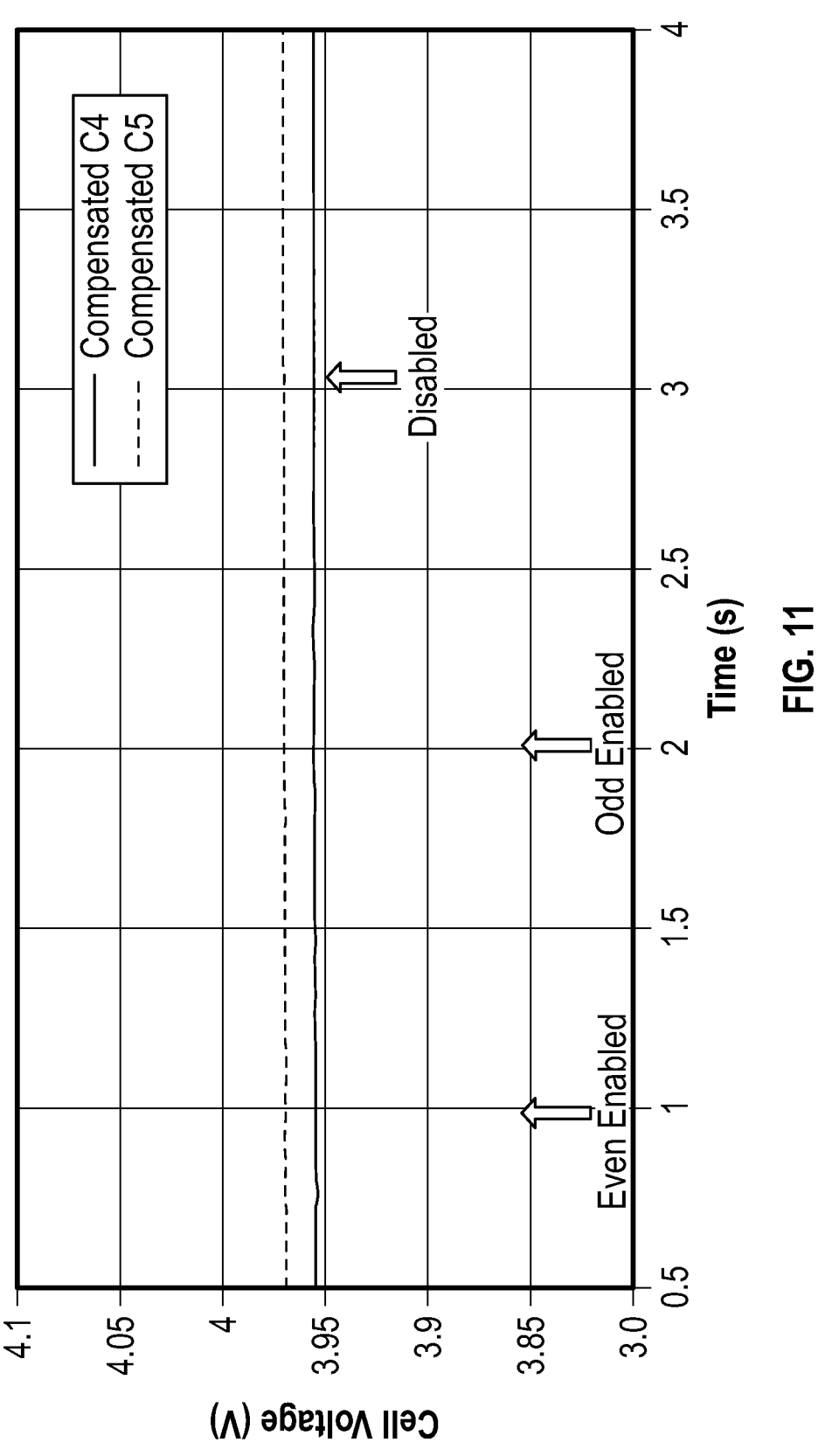
FIG. 11 illustrates a cell voltage plot showing corrected voltage measurements during continuous measurements.

FIG. 11 illustrates a cell voltage plot showing corrected voltage measurements during continuous measurements.

Compare the plots of FIG. 11 and FIG. 4. The DC offsets are eliminated based on the correction factors and slewing errors are eliminated based on the scaling factor described above.

If the system changes the discharge switch state while the digital filter is settling, the index used for IIR scaling of the correction factor can be shifted to reflect the new starting value. Shifting can be accomplished by locating the index of the correction factor currently in use in the table to be used going forward (1-table[CT] to table[CT], for example). This index can then be added to the CT value going forward to appropriately scale the correction factor.

VARIOUS NOTES

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device (e.g., machine, processor) to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times.

Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

The invention claimed is:

1. A method to compensate for a measurement error in a battery management system, the method comprising:
  performing a calibration cycle to calculate a set of correction factors, wherein the set of correction factors are calculated based on determined cable impedances of respective channels in the battery management system, the calibration cycle including:
    disabling one or more discharge switches in the channels in the battery management system,
    performing a first measurement based on the disabling one or more discharge switches in the channels,
    enabling a first discharge switch of the one or more discharge switches in the battery management system,
    performing a second measurement based on the enabling the first discharge switch of the one or more discharge switches,
    enabling a second discharge switch of the one or more discharge switches in the battery management system,
    performing a third measurement based on enabling the second discharge switch of the one or more discharge switches, and
    determining at least one cable impedance based on the first, second, and third measurements;
  receiving a raw voltage measurement; and
  applying at least one correction factor from the set of correction factors to generate a compensated voltage measurement.

2. The method of claim 1, further comprising:
  determining that the raw voltage measurement is receiving during a discharge switch configuration change;
  obtaining a scaling factor related to a filter property used to generate the raw voltage measurement; and
  scaling the at least one correction factor with the scaling factor.

3. A battery management system comprising:
  at least one hardware processor; and
  at least one memory storing instructions that, when executed by the at least one hardware processor, cause the at least one hardware processor to perform operations comprising:
  performing a calibration cycle to calculate a set of correction factors, wherein the set of correction factors are calculated based on determined cable impedances of respective channels in the battery management system, the calibration cycle including:
    disabling one or more discharge switches in the channels in the battery management system,
    performing a first measurement based on the disabling one or more discharge switches in the channels,
    enabling a first discharge switch of the one or more discharge switches in the battery management system,
    performing a second measurement based on the enabling the first discharge switch of the one or more discharge switches,
    enabling a second discharge switch of the one or more discharge switches in the battery management system,
    performing a third measurement based on enabling the second discharge switch of the one or more discharge switches, and
    determining at least one cable impedance based on the first, second, and third measurements;
  receiving a raw voltage measurement; and
  applying at least one correction factor from the set of correction factors to generate a compensated voltage measurement.

4. The battery management system of claim 3, further comprising:
  determining that the raw voltage measurement is receiving during a discharge switch configuration change;
  obtaining a scaling factor related to a filter property used to generate the raw voltage measurement; and
  scaling the at least one correction factor with the scaling factor.

5. A non-transitory machine-readable medium embodying instructions that, when executed by a machine, cause the machine to perform operations comprising:
  performing a calibration cycle to calculate a set of correction factors, wherein the set of correction factors are calculated based on determined cable impedances of respective channels in a battery management system, the calibration cycle including:
    disabling one or more discharge switches in the channels in the battery management system,
    performing a first measurement based on the disabling one or more discharge switches in the channels,
    enabling a first discharge switch of the one or more discharge switches in the battery management system,
    performing a second measurement based on the enabling the first discharge switch of the one or more discharge switches,
    enabling a second discharge switch of the one or more discharge switches in the battery management system,
    performing a third measurement based on enabling the second discharge switch of the one or more discharge switches, and
    determining at least one cable impedance based on the first, second, and third measurements;

receiving a raw voltage measurement; and applying at least one correction factor from the set of correction factors to generate a compensated voltage measurement.

6. The non-transitory machine-readable medium of claim 5, further comprising:

determining that the raw voltage measurement is receiving during a discharge switch configuration change;

obtaining a scaling factor related to a filter property used to generate the raw voltage measurement; and scaling the at least one correction factor with the scaling factor.

7. A method to compensate for a measurement error in a battery management system, the method comprising:

performing a calibration cycle to calculate a set of correction factors, wherein the set of correction factors are calculated based on voltage gain values, the calibration cycle including:

disabling one or more discharge switches in the battery management system, performing a first measurement based on the disabling one or more discharge switches, enabling one or more discharge switches in the battery management system with a discharge configuration, performing a second measurement based on the enabling one or more discharge switches associated with the discharge configuration, and determining the voltage gain values associated with the discharge switch configuration based on the first and second measurements;

receiving a raw voltage measurement; and applying at least one correction factor from the set of correction factors to generate a compensated voltage measurement.

8. The method of claim 7, further comprising:

determining a change to the discharge switch configuration, and performing the calibration cycle with the changed discharge switch configuration to determine voltage gain values associated with the change discharge switch configuration.

9. A battery management system comprising:

at least one hardware processor; and at least one memory storing instructions that, when executed by the at least one hardware processor, cause the at least one hardware processor to perform operations comprising:

performing a calibration cycle to calculate a set of correction factors, wherein the set of correction factors are calculated based on voltage gain values, the calibration cycle including:

disabling one or more discharge switches in the battery management system, performing a first measurement based on the disabling one or more discharge switches, enabling one or more discharge switches in the battery management system with a discharge configuration, performing a second measurement based on the enabling one or more discharge switches associated with the discharge configuration, and determining the voltage gain values associated with the discharge switch configuration based on the first and second measurements;

receiving a raw voltage measurement; and applying at least one correction factor from the set of correction factors to generate a compensated voltage measurement.

10. The battery management system of claim 9, the operations further comprising:

determining a change to the discharge switch configuration, and performing the calibration cycle with the changed discharge switch configuration to determine voltage gain values associated with the change discharge switch configuration.

11. A non-transitory machine-readable medium embodying instructions that, when executed by a machine, cause the machine to perform operations comprising:

performing a calibration cycle to calculate a set of correction factors, wherein the set of correction factors are calculated based on voltage gain values, the calibration cycle including:

disabling one or more discharge switches in the battery management system, performing a first measurement based on the disabling one or more discharge switches, enabling one or more discharge switches in the battery management system with a discharge configuration, performing a second measurement based on the enabling one or more discharge switches associated with the discharge configuration, and determining the voltage gain values associated with the discharge switch configuration based on the first and second measurements;

receiving a raw voltage measurement; and applying at least one correction factor from the set of correction factors to generate a compensated voltage measurement.

12. The non-transitory machine-readable medium of claim 11, the operations further comprising:

determining a change to the discharge switch configuration, and performing the calibration cycle with the changed discharge switch configuration to determine voltage gain values associated with the change discharge switch configuration.

* * * * *